United States Patent
Oda

(10) Patent No.: US 9,873,825 B2
(45) Date of Patent: Jan. 23, 2018

(54) CARBON NANOTUBE SHEET, SEMICONDUCTOR DEVICE, METHOD OF MANUFACTURING CARBON NANOTUBE SHEET, AND METHOD OF MANUFACTURING SEMICONDUCTOR DEVICE

(71) Applicant: SHINKO ELECTRIC INDUSTRIES CO., LTD., Nagano-shi (JP)

(72) Inventor: Takuya Oda, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/533,556

(22) Filed: Nov. 5, 2014

(65) Prior Publication Data
US 2015/0206822 A1    Jul. 23, 2015

(30) Foreign Application Priority Data
Jan. 23, 2014 (JP) ................. 2014-010306

(51) Int. Cl.
  *C09K 5/14* (2006.01)
  *H01L 23/373* (2006.01)
  *H01L 23/433* (2006.01)

(52) U.S. Cl.
CPC .............. *C09K 5/14* (2013.01); *H01L 23/373* (2013.01); *H01L 23/3737* (2013.01); *H01L 23/433* (2013.01); *H01L 2224/16225* (2013.01); *H01L 2224/32225* (2013.01); *H01L 2224/73204* (2013.01); *H01L 2224/73253* (2013.01); *H01L 2924/0002* (2013.01); *H01L 2924/15311* (2013.01); *H01L 2924/16152* (2013.01); *Y10T 428/24777* (2015.01)

(58) Field of Classification Search
None
See application file for complete search history.

(56) References Cited

U.S. PATENT DOCUMENTS

| | | | | |
|---|---|---|---|---|
| 7,641,938 B2* | 1/2010 | Liu | ............ | B82Y 30/00 427/249.1 |
| 2005/0167647 A1* | 8/2005 | Huang | ............ | H01L 23/373 257/14 |
| 2009/0093072 A1* | 4/2009 | Hua | ............ | H01L 23/367 438/15 |
| 2010/0027221 A1* | 2/2010 | Iwai | ............ | H01L 23/373 361/711 |
| 2010/0061063 A1* | 3/2010 | Fairbank | ............ | B82Y 30/00 361/710 |
| 2011/0083836 A1* | 4/2011 | Kobayashi | ............ | H01L 23/373 165/185 |

(Continued)

FOREIGN PATENT DOCUMENTS

JP   2011-96978 A1   5/2011
JP   2012-224507 A1   11/2012

*Primary Examiner* — Erik Kielen
(74) *Attorney, Agent, or Firm* — Kratz, Quintos & Hanson, LLP

(57) ABSTRACT

A carbon nanotube sheet includes a carbon nanotube aggregate in which a plurality of carbon nanotubes are arrayed, a thermoplastic resin portion formed in a center area of the carbon nanotube aggregate, and an uncured thermosetting resin portion formed in an outer periphery area of the carbon nanotube aggregate so as to surround the thermoplastic resin portion.

1 Claim, 15 Drawing Sheets

(56) References Cited

U.S. PATENT DOCUMENTS

| | | |
|---|---|---|
| 2011/0101349 A1 | 5/2011 | Oda |
| 2012/0236502 A1* | 9/2012 | Yamaguchi ........... H01L 23/373 |
| | | 361/704 |
| 2014/0061893 A1* | 3/2014 | Saeidi .................... H01L 23/16 |
| | | 257/712 |

* cited by examiner (plan view)

(plan view)

(partially enlarged view)

(plan view)

CARBON NANOTUBE SHEET, SEMICONDUCTOR DEVICE, METHOD OF MANUFACTURING CARBON NANOTUBE SHEET, AND METHOD OF MANUFACTURING SEMICONDUCTOR DEVICE

CROSS-REFERENCE TO RELATED APPLICATIONS

This application is based upon and claims the benefit of priority of the prior Japanese Patent Application No. 2014-010306, filed on Jan. 23, 2014, the entire contents of which are incorporated herein by reference.

FIELD

This invention is related to a carbon nanotube sheet, a semiconductor device, a method of manufacturing a carbon nanotube sheet, and a method of manufacturing a semiconductor device.

BACKGROUND ART

In the prior art, in the servers and the personal computers, in order to radiate the heat generated from the semiconductor element efficiently, the semiconductor element is connected to the heat spreader through the thermally conductive sheet. As the thermally conductive sheet, indium sheets, silicone grease, or the like is used.

The heat spreader is fixed to contact the semiconductor element through the thermally conductive sheet. Moreover, the thermally conductive sheet needs to be able to absorb the warp or the like caused by the heat generation during the operation of the semiconductor element, and to transfer the heat efficiently.

However, in the case that an indium sheet as the thermally conductive sheet is used, the indium sheet may sometimes be detached at the interface due to the warp of the semiconductor element. Also, in the case that silicone grease as the thermally conductive sheet is used, the pump-out in which the grease is pushed outside by the thermal cycle, or the void is generated easily.

In recent years, the chip size has been increasing by the advancement in the performance of the semiconductor element, and a larger warp tends to be generated during the operation of the semiconductor element. Also, due to the trend for the multi-chip package of the semiconductor elements, a level difference sometimes is generated between a plurality of semiconductor elements. For these reasons, the thermally conductive sheet is desired which have higher thermal conductivity and also have flexibility and that can sufficiently absorb the warp and the level difference in semiconductor elements.

As the thermally conductive sheet having such properties, the technique that uses the carbon nanotubes have been proposed.

A related art is disclosed in Japanese Laid-open Patent Publication No. 2011-96978, and Japanese Laid-open Patent Publication No. 2012-224507.

SUMMARY

According to one aspect discussed herein, there is provided a carbon nanotube sheet, including a carbon nanotube aggregate in which a plurality of carbon nanotubes are arrayed, a thermoplastic resin portion formed in a center area of the carbon nanotube aggregate, and an uncured thermosetting resin portion formed in an outer periphery area of the carbon nanotube aggregate so as to surround the thermoplastic resin portion.

Also, according to another aspect discussed herein, there is provided a semiconductor device, including a wiring substrate, a semiconductor element connected to a connection pad of the wiring substrate, a carbon nanotube sheet arranged on the semiconductor element and including a carbon nanotube aggregate in which a plurality of carbon nanotubes are arrayed, a thermoplastic resin portion formed in a center area of the carbon nanotube aggregate, and a thermosetting resin portion formed in an outer periphery area of the carbon nanotube aggregate so as to surround the thermoplastic resin portion, and a heat radiation member arranged on the carbon nanotube sheet.

Further, according to another aspect discussed herein, there is provided a method of manufacturing a carbon nanotube sheet, including obtaining a carbon nanotube aggregate by forming a plurality of carbon nanotubes on a substrate, arranging a thermoplastic resin material on a center area of the carbon nanotube aggregate, and arranging an uncured thermosetting resin material on an outer-periphery area of the carbon nanotube aggregate so as to surround the thermoplastic resin material, fluidizing the thermoplastic resin material and the thermosetting resin material and impregnating space in the carbon nanotube aggregate with the thermoplastic resin material and the thermosetting resin material by performing a heat process, and removing the substrate.

Furthermore, according to another aspect discussed herein, there is provided a method of manufacturing a semiconductor device, including connecting a semiconductor element to a connection pad of a wiring substrate, preparing a carbon nanotube sheet including a carbon nanotube aggregate in which a plurality of carbon nanotubes are arrayed, a thermoplastic resin portion impregnated in a center area of the carbon nanotube aggregate, and an uncured thermosetting resin portion impregnated in an outer periphery area of the carbon nanotube aggregate so as to surround the thermoplastic resin portion, and wherein an upper end of the carbon nanotube aggregate is coated with the thermosetting resin portion and the thermoplastic resin portion, arranging the carbon nanotube sheet on the semiconductor element, and arranging a heat radiation member on the carbon nanotube sheet and performing a heat process while pressing the neat radiation member downward, thereby the thermoplastic resin portion and the thermosetting resin portion on the carbon nanotube aggregate is pushed out toward a lateral direction, and the upper end of the carbon nanotube aggregate is made to contact the heat radiation member.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, embodiments will be explained with reference to the accompanying drawings.

FIG. 1A to FIG. 2B are views depicting a carbon nanotube sheet of an embodiment. FIG. 3A to FIG. 8 are views depicting a method of manufacturing a carbon nanotube sheet of the embodiment.

Figure 1A:
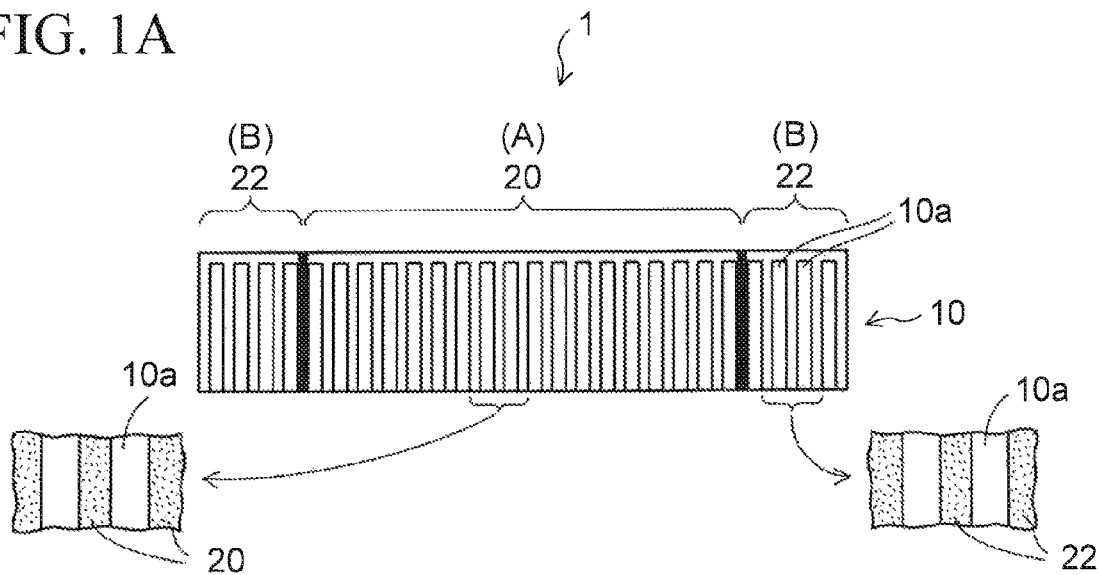
FIGS. 1A and 1B are a cross-sectional view and a plan view depicting a carbon nanotube sheet of an embodiment.
Figure 1B:
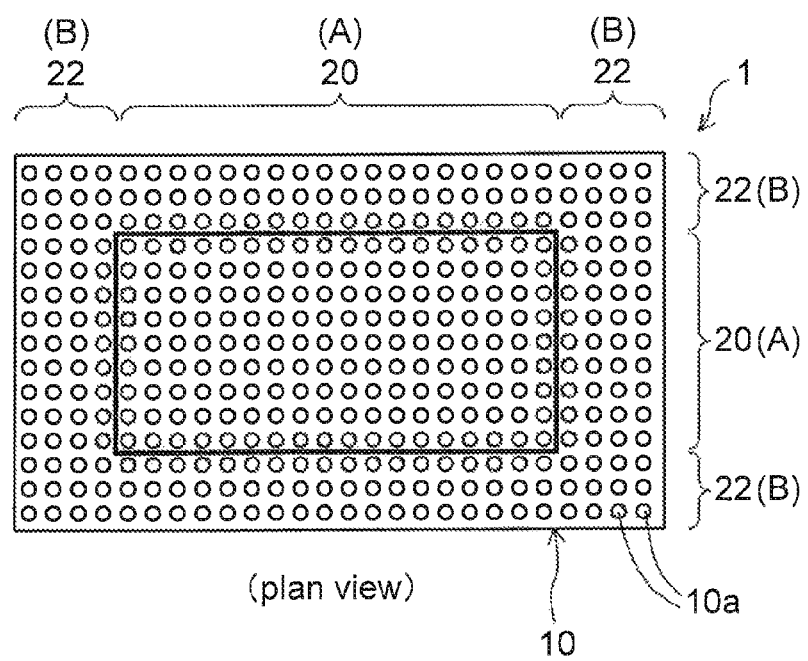

As depicted in FIGS. 1A and 1B, in a carbon nanotube sheet 1 of the embodiment, a plurality of carbon nanotubes 10a which are oriented to the vertical direction are arrayed side by side in a state that minute spaces are opened each other to the lateral direction.

A carbon nanotube aggregate 10 is formed by the plurality of carbon nanotubes 10a. Referring to the plan view in FIG. 1B, the carbon nanotube aggregate 10 is formed in a quadrangle shape.

A thermoplastic resin portion 20 is formed in the spaces in a center area A of the carbon nanotube aggregate 10. The thermoplastic resin portion 20 may be either uncured or cured.

As a preferred example of the thermoplastic resin portion 20, a polyethylene resin with a Young's modulus of about 1.1 GPa or a polypropylene resin with a Young's modulus of about 1.1 GPa is used.

A thermosetting resin portion 22 is formed in the spaces in an outer periphery area B of the carbon nanotube aggregate 10 so as to surround the thermoplastic resin portion 20. The thermosetting resin portion 22 is in an uncured state. As a preferred example of the thermosetting resin portion 22, an epoxy resin with a Young's modulus of about 2.4 GPa or a polyimide resin with a Young's modulus of about 2.8 GPa is used.

As described above, the thermoplastic resin portion 20 has the property in which Young's modulus is smaller than that of the thermosetting resin portion 22. One with the smaller the Young's modulus has the property in which the flexibility is excellent, and other with the larger the Young's modulus has the property in which the flexibility is lower and the hardness is higher.

The thermoplastic resin portion 20 has higher flexibility than the thermosetting resin portion 22, and has adequate elasticity. On the other hand, the thermosetting resin portion 22 has low flexibility but high adhesive strength.

As will be described later, the carbon nanotube sheet 1 of the embodiment is arranged between the upper face of a semiconductor element and the lower face of a heat radiation member, and functions as a thermally conductive sheet. The thermally conductive sheet is also called TIM (Thermal Interface Material).

By arranging the thermoplastic resin portion 20, which has adequate flexibility, in the center area A of the carbon nanotube sheet 1, it is possible to sufficiently absorb the warp or the like caused by the heat generation at the time of the operation of the semiconductor element.

Further, by arranging the thermosetting resin portion 22, which has high adhesive strength, in the outer-periphery area B of the carbon nanotube sheet 1, it is possible to firmly bond the outer periphery area B of the carbon nanotube sheet 1 to the semiconductor element and the heat radiation member.

The thermoplastic resin portion 20 and the thermosetting resin portion 22 coat the upper ends of the respective carbon nanotubes 10a. On the other hand, the lower ends of the respective carbon nanotubes 10a are exposed from the thermoplastic resin portion 20 and the thermosetting resin portion 22.

The thermal conductivity of each carbon nanotube 10a is about 1500 W/mK to 3000 W/mK, which is significantly higher than the thermal conductivity of indium (about 81 W/mK). In addition, the carbon nanotube 10a has significantly higher mechanical strength than indium.

For these reasons, the carbon nanotube sheet 1 can be preferably used as the thermally conductive sheet for transferring heat generated from the semiconductor element to the heat radiation member.

As described above, the carbon nanotube sheet 1 of the embodiment is arranged between the semiconductor element and the heat radiation member; and functions as the thermally conductive sheet. Here, since the thermal conductivity of the thermoplastic resin portion 20 and the thermosetting resin portion 22 is low, the thermoplastic resin portion 20 and the thermosetting resin portion 22 coating the upper ends of the respective carbon nanotubes 10a are pressed by the heat radiation member and pushed out to the lateral direction.

By this matter, the upper ends of the respective carbon nanotubes 10a contact the lower face of the heat radiation member.

For the above reason, the thermosetting resin portion 22 is in an uncured state. Moreover, even after being cured, the thermoplastic resin portion 20 fluidizes when re-heated. Therefore, the thermoplastic resin portion 20 may be either in a cured state or in an uncured state.

Figure 2A:
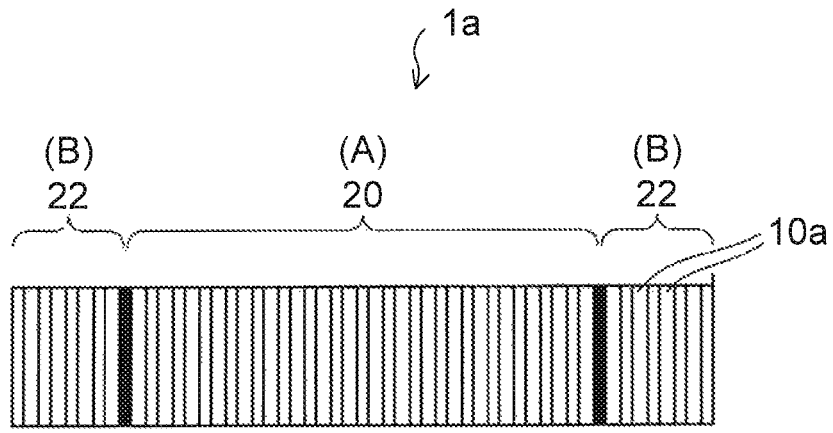
FIGS. 2A and 2B are a cross-sectional view and a plan view depicting a carbon nanotube sheet of a modification of the embodiment.
Figure 2B:
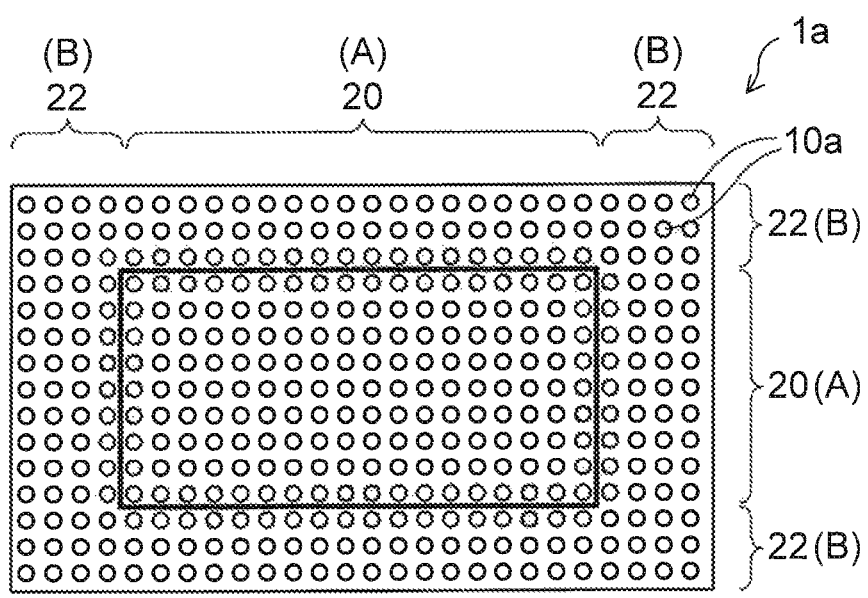

Alternatively, like a carbon nanotube sheet 1a in FIGS. 2A and 2B, the upper ends of the respective carbon nanotubes 10a are exposed from the upper faces of the thermoplastic resin portion 20 and the thermosetting resin portion 22. In this case, the thermoplastic resin portion 20 and the thermosetting resin portion 22 on the upper face side of the carbon nanotube sheet 1 in FIGS. 1A and 1B described above are polished by mechanical polishing until the upper ends of the carbon nanotubes 10a are exposed. The other features of the structure are the same as those of the carbon nanotube sheet 1 in FIGS. 1A and 1B.

When using the carbon nanotube sheet 1a in FIGS. 2A and 2B as the thermally conductive sheet, the exposed faces of the upper ends of the carbon nanotubes 10a contact the heat radiation members in the same state.

The carbon nanotube sheet 1a in FIGS. 2A and 2B requires the mechanical polishing step, therefore is disadvantageous in terms of manufacturing cost, as compared with the carbon nanotube sheet 1 in FIGS. 1A and 1B.

Next, a method of manufacturing the carbon nanotube sheet 1 in FIGS. 1A and 1B will be explained.

Figure 3A:
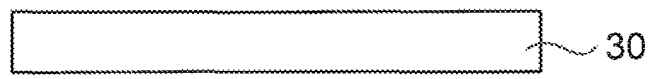
FIGS. 3A to 3D are cross-sectional views depicting a method of manufacturing a carbon nanotube sheet of the embodiment (part 1).

As depicted in FIG. 3A, first, a silicon substrate 30 is prepared. The silicon substrate 30 is used as a base for forming the carbon nanotubes. Silicon oxide films may be formed on both faces of the silicon substrate 30. A plurality of carbon-nanotube forming areas is defined on the silicon substrate 30. FIG. 3A depicts one of the carbon-nanotube forming areas.

The silicon substrate 30 is illustrated as the substrate, but various other substrates such as a ceramic substrate and a glass substrate can be used.

Figure 3B:

Then, as depicted in FIG. 3B, an iron (Fe) film whose thickness is about 2.5 nm is formed by sputtering or the like on the entire surface of the silicon substrate 30, thus a catalytic metal film 32 is obtained. The catalytic metal film 32 is formed as a catalyst for forming carbon nanotubes by the CVD method.

Besides iron, cobalt (Co), nickel (Ni), gold (Au), silver (Ag), or platinum (Pt) may be used as the catalytic metal film 32.

Figure 3C:

Then, as depicted in FIG. 3C, the heat process is performed to the silicon substrate 30 sit a temperature of 650° C. for 5 to 10 minutes. By this matter, the catalytic metal film 32 is transformed into micro-particles, thus catalytic metal micro-particles 32a are obtained.

Figure 3D:
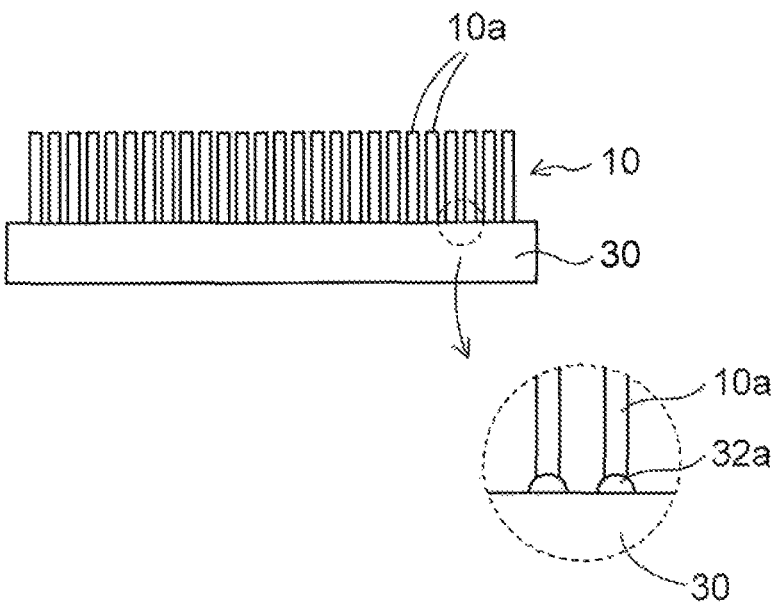

Thereafter, as depicted in FIG. 3D, a plurality of carbon nanotubes 10a are grown on the silicon substrate 30 by thermal CVD (Chemical Vapor Deposition) method while using the catalytic metal micro-particles 32a as the catalyst. By this matter, a carbon nanotube aggregate 10 in which the plurality of carbon nanotubes 10a are formed side by side in the lateral direction is obtained.

As depicted in the partially enlarged view in FIG. 3D, the carbon nanotubes 10a which are grown on the catalytic metal micro-particles 32a are formed to be oriented toward the vertical direction to the surface of the silicon substrate 30.

The growth condition of the carbon nanotubes 10a by thermal CVD is as follows, for example. A mixed gas of acetylene and argon with a partial pressure ratio of 1:9 is used as a raw material gas; the total gas pressure in a film forming chamber is set to 1 kPa; the temperature is set to 650° C.; and the growth time is set to 30 minutes.

Figure 4A:
FIGS. 4A and 4B are cross-sectional views depicting the method of manufacturing a carbon nanotube sheet of the embodiment (part 2).
Figure 4A:
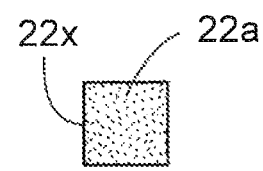

Then, as depicted in FIG. 4A, a thermosetting resin sheet 22a in which an opening portion 22x is provided in the center part is prepared. The thermosetting resin sheet 22a is uncured (B-stage) resin. The thermosetting resin sheet 22a is an example of a thermosetting resin material and is a resin material for forming the thermosetting resin portion 22 of the carbon nanotube sheet 1 in FIGS. 1A and 1B mentioned above.

Figure 4B:
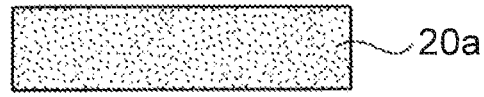

Also, as depicted in FIG. 4B, an uncured thermoplastic resin sheet 20a has a size corresponding to a size of the opening portion 22x of the thermosetting resin sheet 22a is prepared. The thermoplastic resin sheet 20a is an example of a thermoplastic resin material and is a resin material for forming the thermoplastic resin portion 20 of the carbon nanotube sheet 1 in FIGS. 1A and 1B mentioned above.

Figure 5A:
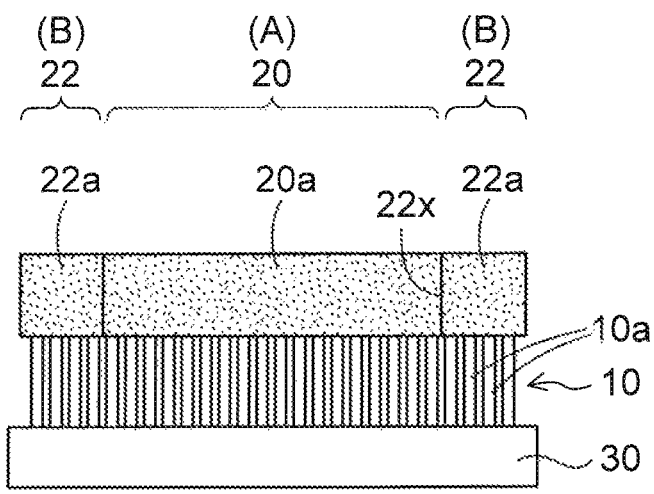
FIGS. 5A and 5B are a cross-sectional view and a plan view depicting the method of manufacturing a carbon nanotube sheet of the embodiment (part 3).
Figure 5B:
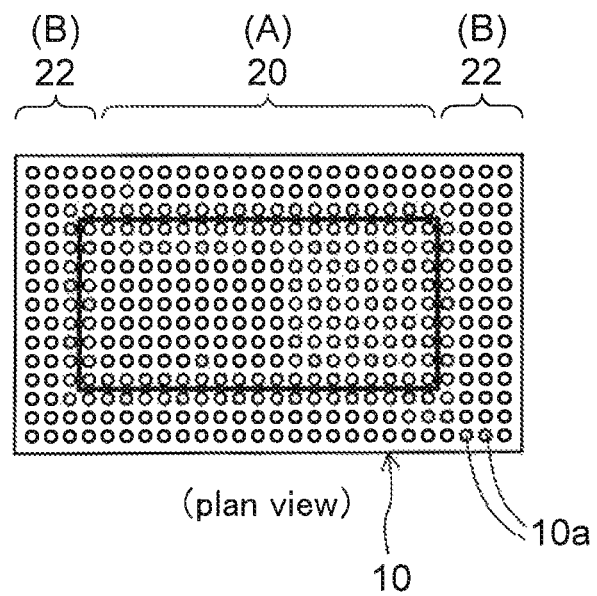

Thereafter, as depicted in FIGS. 5A and 5B, the thermosetting resin sheet 22a in FIG. 4A is arranged on the outer periphery area B of the carbon nanotube aggregate 10. Further, the thermoplastic resin sheet 20a in FIG. 4A is arranged in the opening portion 22x of the thermosetting resin sheet 22a. By this matter, the thermosetting resin sheet 22a is arranged on the outer periphery area B of the carbon nanotube aggregate 10 so as to surround the thermoplastic resin sheet 20a arranged on the center area A of the carbon nanotube aggregate 10.

Then, the heat process is performed while pressing the thermoplastic resin sheet 20a and the thermosetting resin sheet 22a downward by a pressing member (not depicted), under conditions of a temperature of 200° C. and a process time of 1 minute.

Figure 6A:
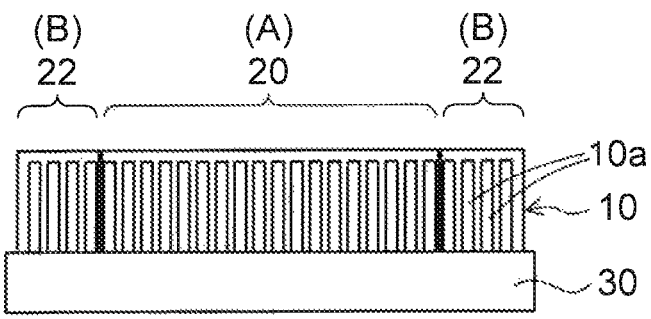
FIGS. 6A and 6B are a cross-sectional view and a plan view depicting the method of manufacturing a carbon nanotube sheet of the embodiment (part 4).
Figure 6B:
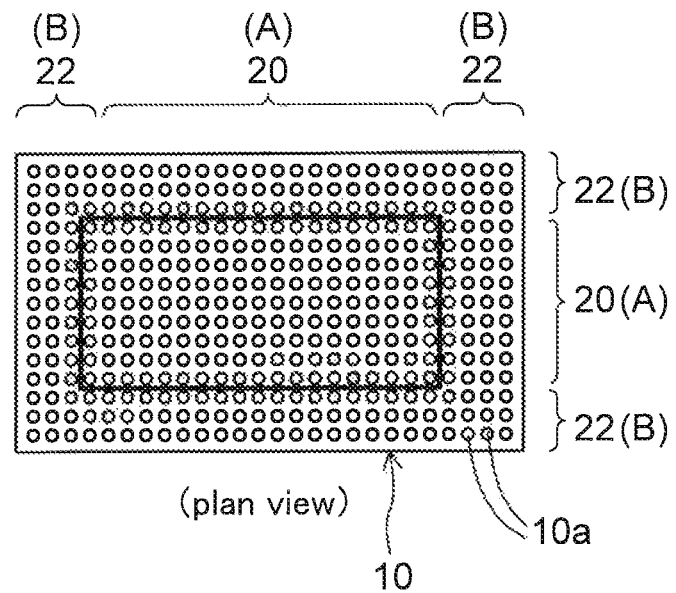

By this matter, as depicted in FIGS. 6A and 6B, the thermoplastic resin sheet 20a and the thermosetting resin sheet 22a arranged on the carbon nanotube aggregate 10 are softened, and the respective resins are made to flow into the spaces in the carbon nanotube aggregate 10 to impregnate the spaces with the resins.

In this way, the spaces in the center area A of the carbon nanotube aggregate 10 is impregnated with the thermoplastic resin portion 20, and the spaces in the outer periphery area B is impregnated with thermosetting resin portion 22.

In the case that the above-described conditions for heating the resins is employed, the thermoplastic resin portion 20 and the thermosetting resin portion 22 are still in an uncured state at this point.

By the above steps, the carbon nanotube aggregate 10 is integrated by the thermoplastic resin portion 20 and the thermosetting resin portion 22, and is constituted like the sheet.

In the embodiment described above, the thermoplastic resin portion 20 and the thermosetting resin portion 22 are formed at the same time by heating the thermoplastic resin sheet 20a and the thermosetting resin sheet 22a. Alternatively, after the thermoplastic resin portion 20 is formed, the thermosetting resin portion 22 may be formed. Also inversely after the thermosetting resin portion 22 is formed, the thermoplastic resin portion 20 may be formed.

Also alternatively, the thermoplastic resin portion 20 and the thermosetting resin portion 22 may be formed by coating separately a liquid thermoplastic resin and a liquid thermosetting resin in difference areas by dispensers or the like.

Figure 7:
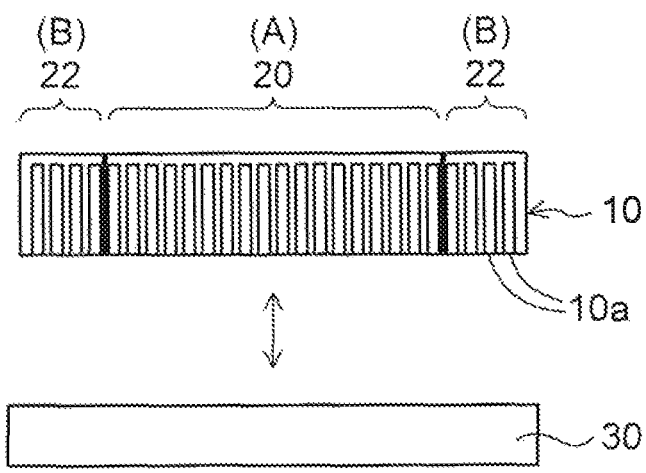
FIG. 7 is a cross-sectional view depicting the method of manufacturing a carbon nanotube sheet of the embodiment (part 5).
Figure 8:
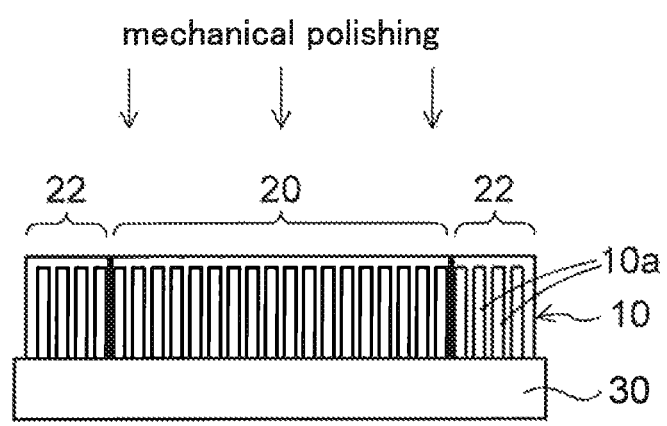
FIG. 8 is a cross-sectional view depicting the method of manufacturing a carbon nanotube sheet of the embodiment (part 6).

Thereafter, as depicted in FIG. 7, the carbon nanotube aggregate integrated like the sheet is detached from the silicon substrate 30. Then, the carbon nanotube aggregate 10 integrated like the sheet is cut such that individual carbon-nanotube forming area can be obtained.

By the above steps, the carbon nanotube sheet 1 in FIGS. 1A and 1B mentioned above is manufactured. Since the carbon nanotube aggregate 10 is integrated by the resins and is constituted as one sheet, the carbon nanotube sheet 1 has good handling ability.

In the case that the carbon nanotube sheet 1a in FIGS. 2A and 2B mentioned above is employed, as depicted in FIG. 8, after the step in FIG. 6A mentioned above, the thermoplastic resin portion 20 and the thermosetting resin portion 22 on the upper face side of the carbon nanotube aggregate 10 are removed by mechanical polishing or the like. By this matter, the upper ends of the respective carbon nanotubes 10a are exposed from the thermoplastic resin portion 20 and the thermosetting resin portion 22.

Next, a method of manufacturing a semiconductor device using the carbon nanotube sheet 1 in FIGS. 1A and 1B as a thermally conductive sheet will be explained.

Figure 9A:
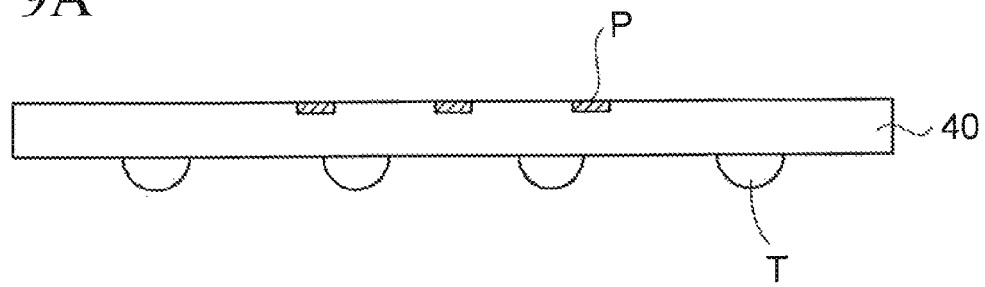
FIGS. 9A to 9C are cross-sectional views depicting a method of manufacturing a semiconductor device of the embodiment (part 1).

As depicted in FIG. 9A, first, a wiring substrate 40 is prepared. The wiring substrate 40 includes connection pads P made of copper or the like in the upper face side, and also includes external connection terminals T made of solder or the like on the lower face side. The connection pads P are electrically connected to the external connection terminals T through multi-layer wirings (not depicted) formed in the inside of the wiring substrate 40.

Figure 9B:
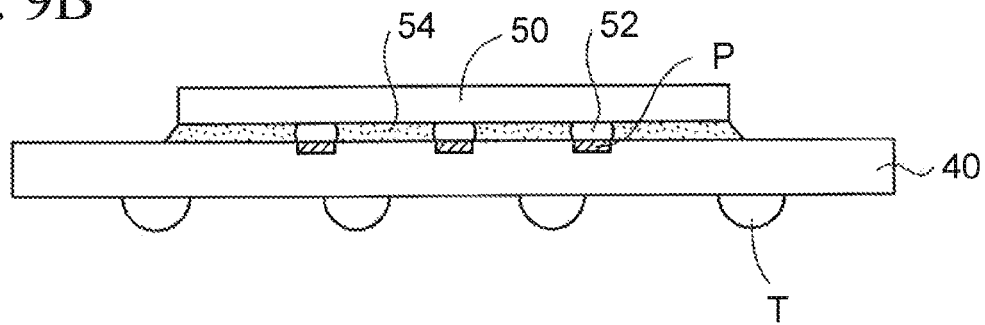

Then, as depicted in FIG. 9B, a semiconductor element 50 (LSI chip) including bump electrodes 52 on the lower face side is prepared. Then, the bump electrodes 52 of the semiconductor element 50 are flip-chip connected to the connection pads P of the wiring substrate 40 through solder (not depicted). As the semiconductor element 50, a CPU chip or the like in which the amount of the heat generation at the time of the operation is large is used.

Then, an underfill resin 54 is filled in the space between the semiconductor element 50 and the wiring substrate 40.

Figure 9C:
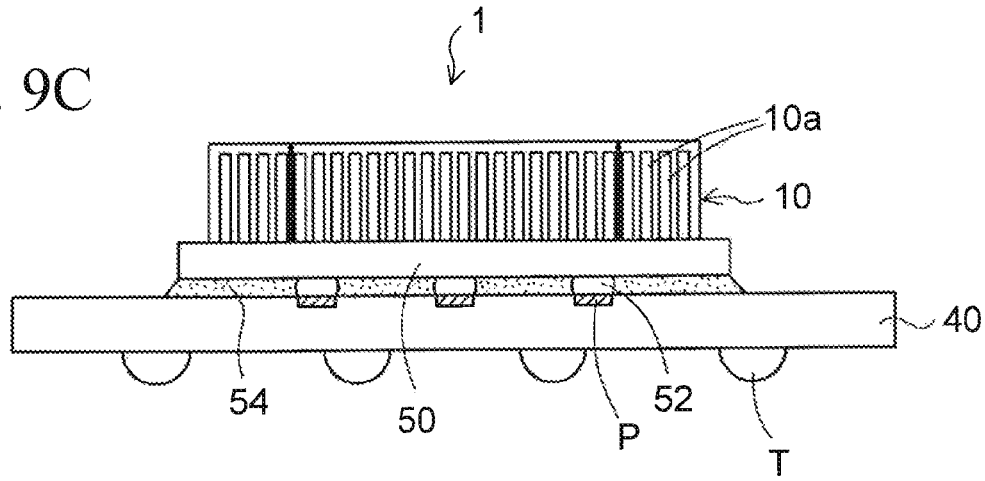

Then, as depicted in FIG. 9C, the carbon nanotube sheet 1 in FIGS. 1A and 1B mentioned above is arranged on the upper face of the semiconductor element 50. The carbon nanotube sheet 1 is arranged on the upper face of the semiconductor element 50 such that the face side where the thermoplastic resin portion 20 and the thermosetting resin portion 22 cover the carbon nanotubes 10a is situated to the upper side.

Figure 10:
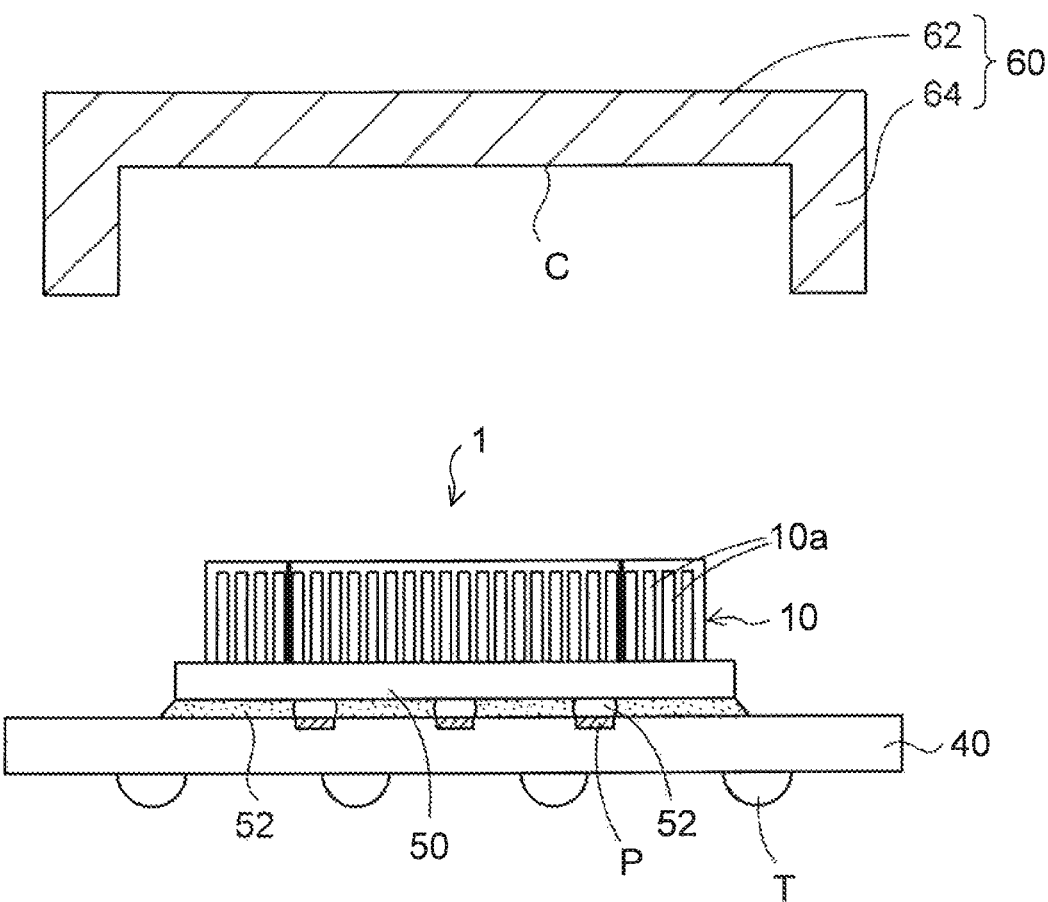
FIG. 10 is a cross-sectional view depicting the method of manufacturing a semiconductor device of the embodiment (part 2).

Subsequently, as depicted in FIG. 10, a heat spreader 60 is prepared as the heat radiation member. The heat spreader 60 includes a flat plate portion 62 and an annular protruding portion 64 protruding downward from the periphery thereof, and a concave portion C is provided in the center part of the lower face side. As an example of the heat spreader 60, a member in which nickel plating is applied to an outer face of an oxygen-free copper member is used.

Figure 11:
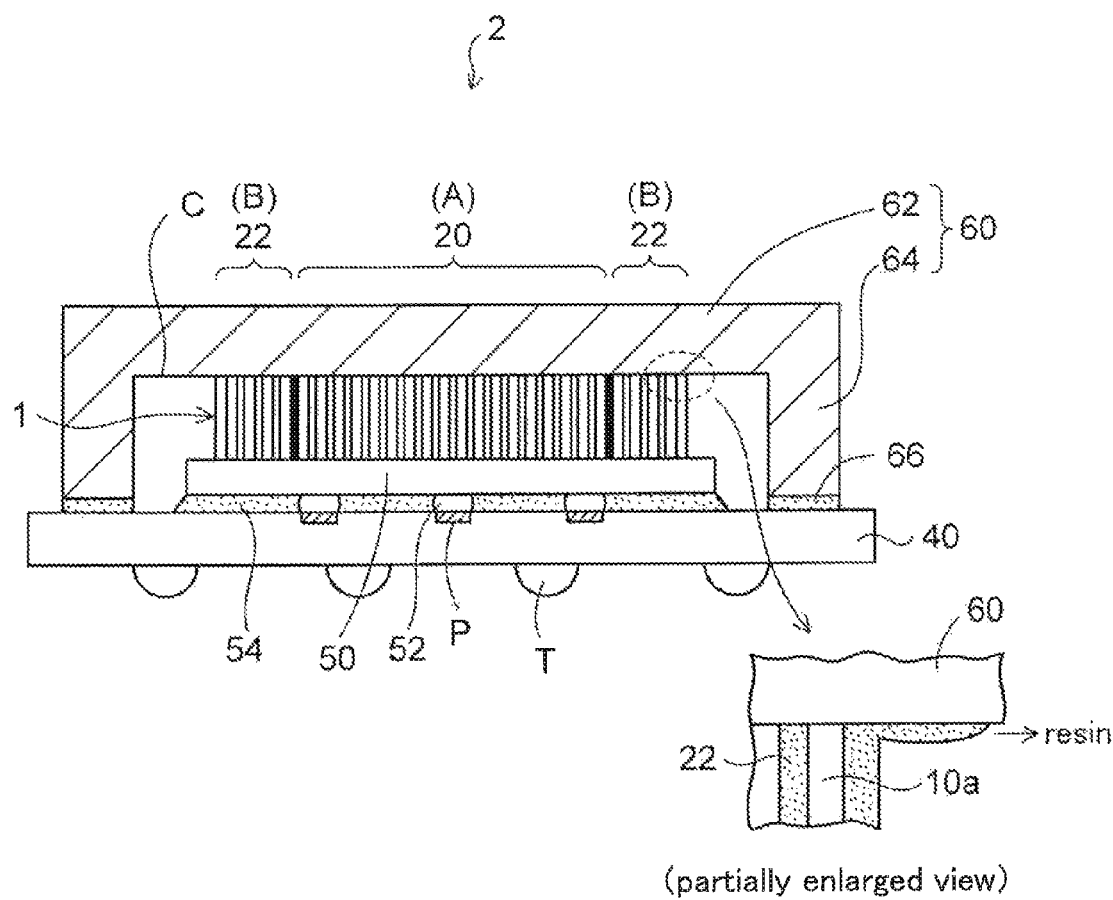
FIG. 11 is a cross-sectional view depicting a semiconductor device of the embodiment (part 1).

Then, as depicted in FIG. 11, the protruding portion 64 of the heat spreader 60 is arranged on a periphery part of the wiring substrate 40 through an adhesive agent 66 having the thermosetting property.

Further, a heat process is performed while pressing the heat spreader 60 downward by a pressing member (not depicted) under conditions of a temperature of 250° C. and a process time of 20 to 30 minutes.

Here, the depth of the concave portion G of the heat spreader 60 is adjusted such that the bottom face of the concave portion C of the heat spreader 60 can touch the upper ends of the respective carbon nanotubes 10a of the carbon nanotube sheet 1.

By this matter, as depicted in the partially enlarged view in FIG. 11, the thermoplastic resin portion 20 and the uncured thermosetting resin portion 22 on the upper side of the carbon nanotube sheet 1 are fluidized and pushed out toward the lateral direction. Even in the case that the thermoplastic resin portion 20 has been cured, it is softened when re-heated, and is pushed out toward the lateral direction.

By this matter, it is in a state that the upper ends of the respective carbon nanotubes 10a of the carbon nanotube sheet 1 contact the bottom face of the concave portion C of the heat spreader 60. Since the lower ends of the respective carbon nanotubes 10a of the carbon nanotube sheet 1 are originally exposed, it is in a state that the lower ends of the respective carbon nanotubes 10a contact the upper face of the semiconductor element 50.

By this heat process, the thermoplastic resin portion 20 and the thermosetting resin portion 22 of carbon nanotube sheet 1 are completely cured.

By this matter, the upper face of the carbon nanotube sheet 1 and the bottom face of the concave portion C of the heat spreader 60 are bonded by the thermoplastic resin portion 20 and the thermosetting resin portion 22. Also simultaneously, the lower face of the carbon nanotube sheet 1 and the upper face of the semiconductor element 50 are bonded by the thermoplastic resin portion 20 and the thermosetting resin portion 22. Further simultaneously, the protruding portion 64 of the heat spreader 60 is bonded to the periphery part of the wiring substrate 40 by the adhesive agent 66 having the thermosetting property.

By the above steps, a semiconductor device 2 of the embodiment is manufactured.

Note that, after the upper face side of the carbon nanotube sheet 1 is pressed and bonded to the bottom surface of the concave portion C of the heat spreader 60, the lower face side of the carbon nanotube sheet 1 may be bonded to the upper face of the semiconductor element 50.

As depicted in FIG. 11, in the semiconductor device 2 of the embodiment, the bump electrodes 52 of the semiconductor element 50 are flip-chip connected to the connection pads P of the wiring substrate 40 explained with reference to FIG. 9A mentioned above. The underfill resin 54 is filled between the semiconductor element 50 and the wiring substrate 40.

Moreover, the annular protruding portion 64 of the heat spreader 60 is bonded to the periphery part of the wiring substrate 40 by the adhesive agent 66. By this matter, the semiconductor element 50 is housed in the concave portion C of the heat spreader 60.

The carbon nanotube sheet 1 in FIG. 1A as the thermally conductive sheet is provided in an area between the upper face of the semiconductor element 50 and the bottom face of the concave portion C of the heat spreader 60. The lower face of the outer periphery area B of the carbon nanotube sheet 1 is bonded to the upper face of the semiconductor element 50 by the thermosetting resin portion 22. Moreover, the upper face of the outer periphery area B of the carbon nanotube sheet 1 is bonded to the bottom face of the concave portion C of the heat spreader 60 by the thermosetting resin portion 22.

Further, the lower face of the center area A of the carbon nanotube sheet 1 is bonded to the upper face of the semiconductor element 50 by the thermoplastic resin portion 20. Further, the upper face of the center area A of the carbon nanotube sheet 1 is bonded to the bottom face of the concave portion C of the heat spreader 60 by the thermoplastic resin portion 20.

Then, the lower ends of the respective carbon nanotubes 10a of the carbon nanotube sheet 1 contact the upper face of the semiconductor element 50. Also, the upper ends of the respective carbon nanotubes 10a of the carbon nanotube sheet 1 contact the bottom face of the concave portion C of the heat spreader 60.

In this way, in the semiconductor device 2 of the embodiment, as explained in the manufacturing method mentioned above, the upper ends and lower ends of the carbon nanotubes 10a which have high thermal conductivity can be surely made to contact the heat spreader 60 and the semiconductor element 50.

By this matter, the thermal resistance of the thermal conduction paths is made small, and heat generated from the semiconductor element 50 can be sufficiently transferred to the heat spreader 60 side through the carbon nanotube sheet 1, thus the heat radiation can be performed.

Moreover, the thermoplastic resin portion 20 having adequate flexibility is formed in the center area A of the carbon nanotube sheet 1. For this reason, even when the warp is generated in the semiconductor chip 50 by the heat generation during the operation of the semiconductor chip 50, the warp can be absorbed by the thermoplastic resin portion 20.

Therefore, even when the warp is generated in the semiconductor element 50 during the operation, the upper ends and lower ends of the respective carbon nanotubes 10a can invariably contact the heat spreader 60 and the semiconductor element 50. For this reason, the changes in the contact thermal resistance of the thermal conduction paths in the semiconductor device 2 can be suppressed, therefore the high heat radiation performance can be stably obtained. By this matter, the semiconductor element 50 such as a CPU chip in which the amount of the heat generation is large can be made to operate normally.

Moreover, even in the case that a level difference is generated between a plurality of semiconductor elements by the multi-chip package of the semiconductor elements, the level difference can be absorbed by the thermoplastic resin portion 20 having the flexibility.

Also, the thermosetting resin portion 22 in which the flexibility and the flowability are low, but the adhesive strength is high is formed in the outer periphery area B of the carbon nanotube sheet 1. By this matter, the carbon nanotube sheet 1 can be firmly bonded to the semiconductor element 50 and the heat spreader 60.

Therefore, even when the warp is generated in the semiconductor element 50 during the operation, the bond of the carbon nanotube sheet 1 with the semiconductor element 50 and the heat spreader 60 is maintained, thus, the detachment of the carbon nanotube sheet 1 is prevented.

Moreover, since the resin of the thermosetting resin portion 22 in the outer periphery area 3 has higher rigidity than the resin of the thermoplastic resin portion 20 in the center area A, the compressive deformation of the carbon nanotube sheet 1 can be prevented.

Further, since the carbon nanotubes 10a exist also in the thermosetting resin portion 22 in the outer periphery area B, the thermal conductivity in the outer periphery area B is high as well. Thus, the heat of the semiconductor element 50 can be efficiently transferred to the heat spreader 60.

In this way, the carbon nanotube sheet 1 of the embodiment has the adequate flexibility in the center area A and also the high adhesibility in the outer periphery area B. Therefore, even when the warp is generated in the semiconductor element 50, the heat can be stably transferred without generating the detachment of the carbon nanotube sheet 1.

Here, the case of using a carbon nanotube sheet obtained by impregnating the entire area with the thermosetting resin and curing it, unlike the above embodiment, will be mentioned. In this case, the cured thermosetting resin is not fluidized even when re-heated. Therefore, it is difficult to expose the upper ends of the carbon nanotubes 10a and to be made to contact the heat spreader 60 in the step in FIG. 11 mentioned above.

On the other hand, even after being cured, the thermoplastic resin can be fluidized when re-heated. Therefore, the embodiment is also advantageous from a viewpoint in which the upper ends of the carbon nanotubes 10a in the main part can be easily exposed without limiting the process.

Figure 12:
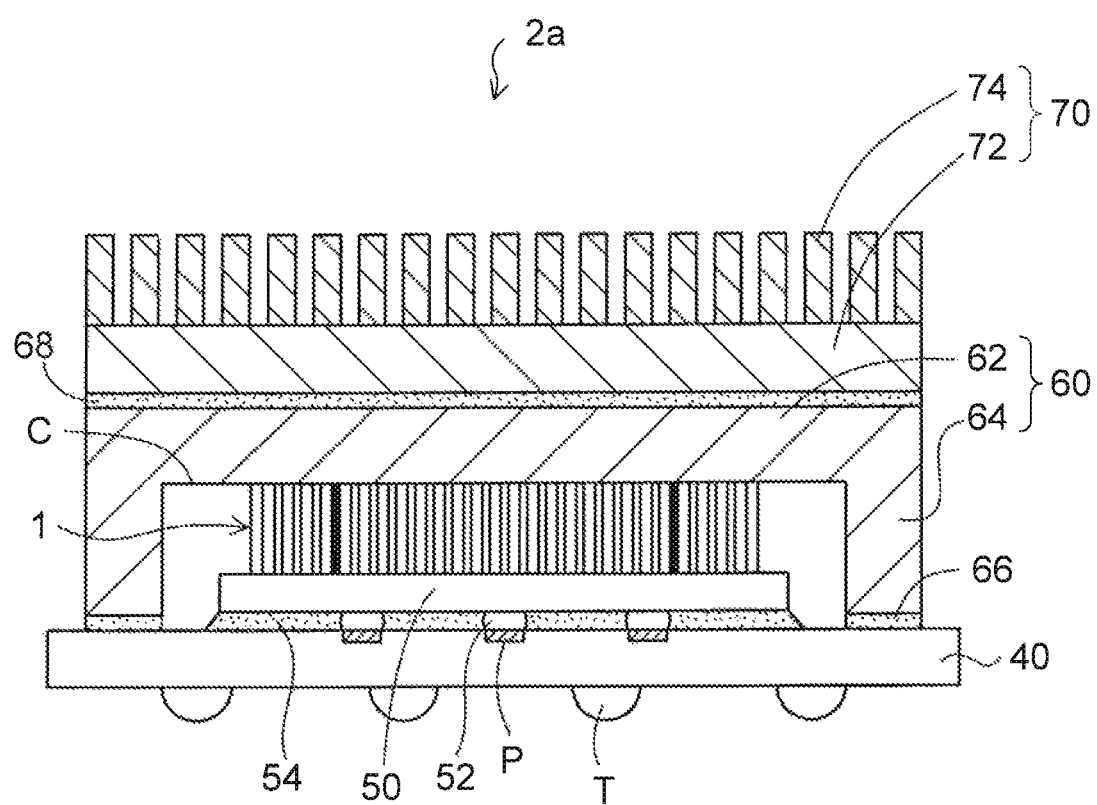
FIG. 12 is a cross-sectional view depicting a semiconductor device of the embodiment (part 2).

In semiconductor device 2a depicted in FIG. 12, a heat sink 70 is further provided on the heat spreader 60 of the semiconductor device 2 in FIG. 11 through a thermal conduction member 68. The heat sink 70 is formed of a flat plate portion 72 and many heat radiation fins 74 protruding upward therefrom. The carbon nanotube sheet 1 of the embodiment described above may be used as the thermal conduction member 68.

The heat spreader 60 and the heat sink 70 of the semiconductor device 2a in FIG. 12 are an example of the heat radiation member.

Figure 13:
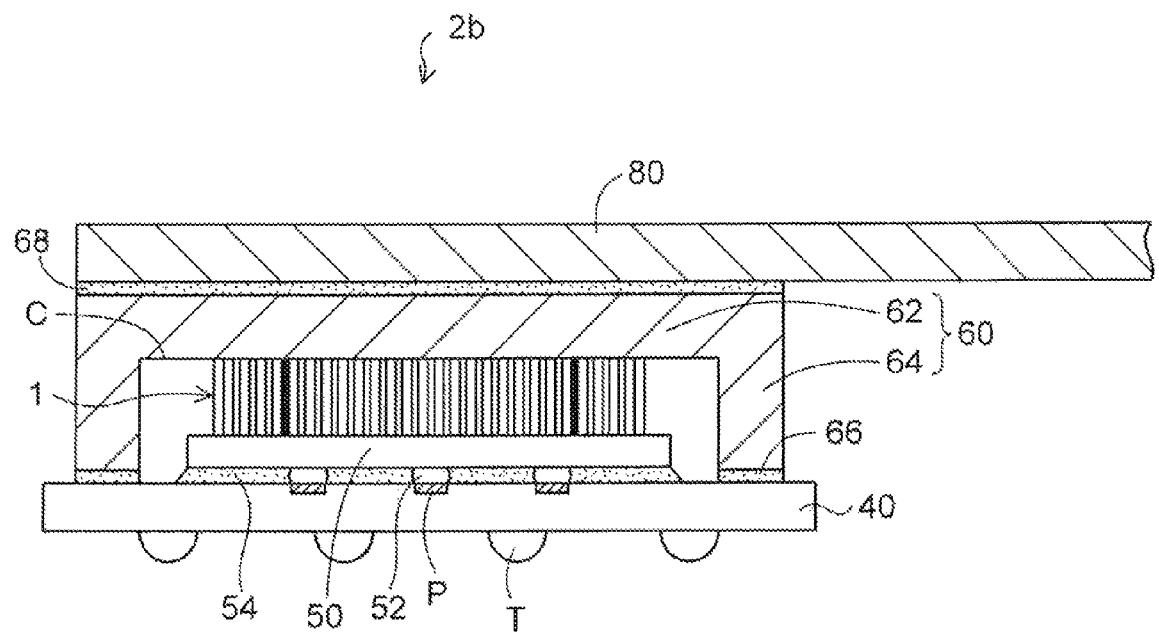
FIG. 13 is a cross-sectional view depicting a semiconductor device of the embodiment (part 3).

Further, in a semiconductor device 2b depicted in FIG. 13, a heat pipe 80 is further provided on the heat spreader 60 of the semiconductor device 2 in FIG. 11 through the thermal conduction member 68. The heat pipe 80 transports and radiates the heat by the phase change of the evaporation and the condensation in the operating fluid sealed in a hermetically-closed pipe.

In the semiconductor device 2b in FIG. 13 as well, the carbon nanotube sheet 1 of the embodiment described above may be used as the thermal conduction member 68.

The heat spreader 60 and the heat pipe 80 of the semiconductor device 2b in FIG. 13 are an example of the heat radiation member.

Other Embodiments

In the carbon nanotube sheet 1 in FIGS. 1A and 1B mentioned above, the thermoplastic resin portion 20 is integrally formed in the entire center area A of the carbon nanotube aggregate 10.

Figure 14:
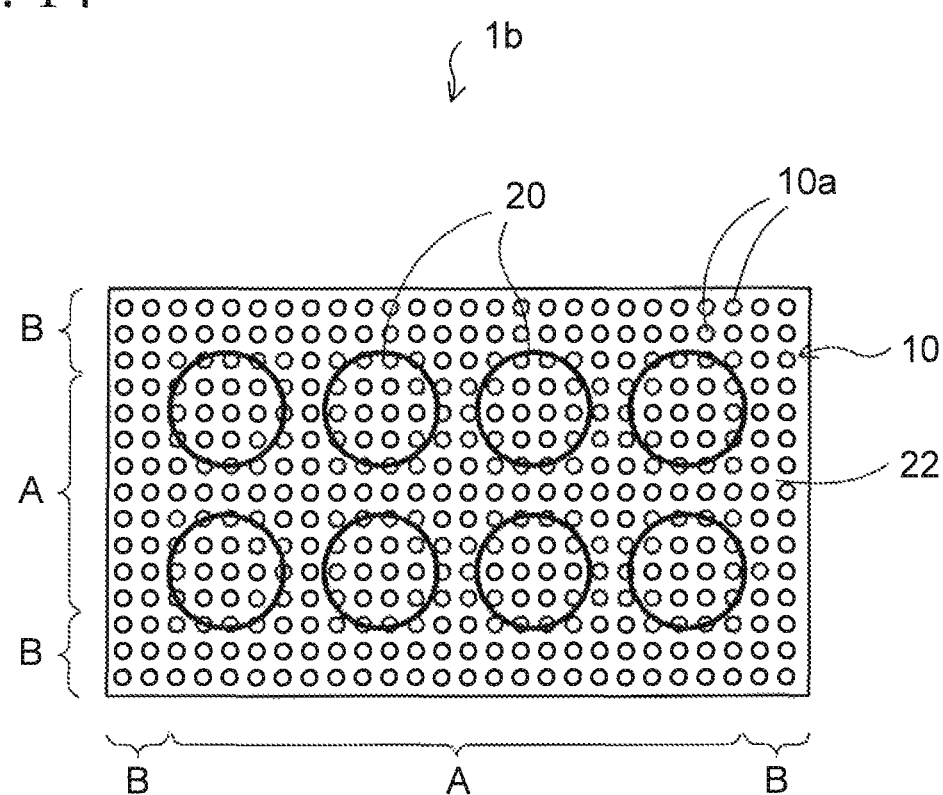
FIG. 14 is a cross-sectional view depicting a carbon nanotube sheet of another embodiment (part 1).

In a carbon nanotube sheet 1b depicted in FIG. 14, the thermoplastic resin portions 20 are arranged to be divided into the plural areas in a center area A of a carbon nanotube aggregate 10. Then, the thermosetting resin portion 22 is formed to extend from an outer periphery area B of the carbon nanotube aggregate 10 to the center area A, and thus the thermosetting resin portion 22 is formed to surround the plurality of thermoplastic resin portions 20.

By arranging the plurality of thermoplastic resin portions 20 which are divided at positions coinciding with parts of a semiconductor element where the heat is easily generated, the heat from the semiconductor element can be efficiently transferred to the outside. Moreover, since the thermosetting resin portion 22 having high adhesibility is formed also in part of the center area A of the carbon nanotube sheet 1b, this arrangement is favorable in the case that the adhesive strength is made strong.

The plurality of thermoplastic resin portions 20 can employ various shapes other than a circular shape such as a quadrangle shape. In addition, the number of divided parts can be set to any suitable number.

The manufacture of the carbon nanotube sheet 1b in FIG. 14 may be performed by arranging a thermosetting resin in which a plurality of opening portions are provided, on the carbon nanotube aggregate 10, and arranging a thermoplastic resin in each of the opening portions respectively, and impregnating the spaces between carbon nanotubes 10a with the resins in a similar manner, in the step in FIGS. 5A and 5B mentioned above.

Figure 15A:
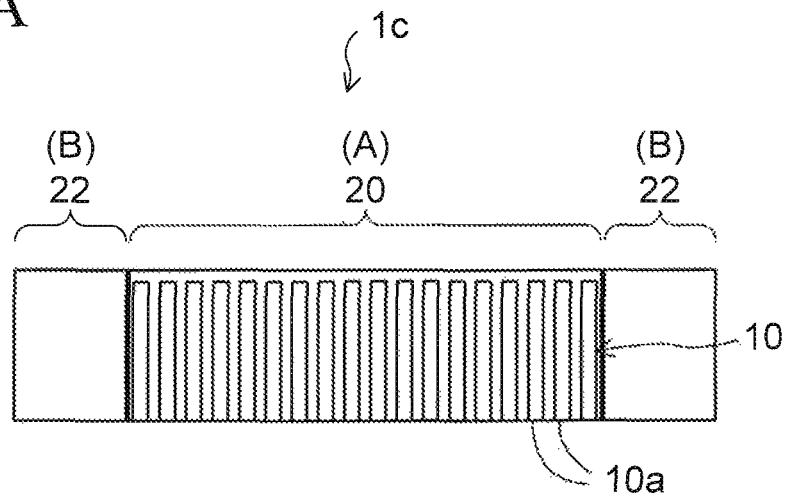
FIGS. 15A and 15E are cross-sectional views depicting a carbon nanotube sheet of still another embodiment (part 2).
Figure 15B:
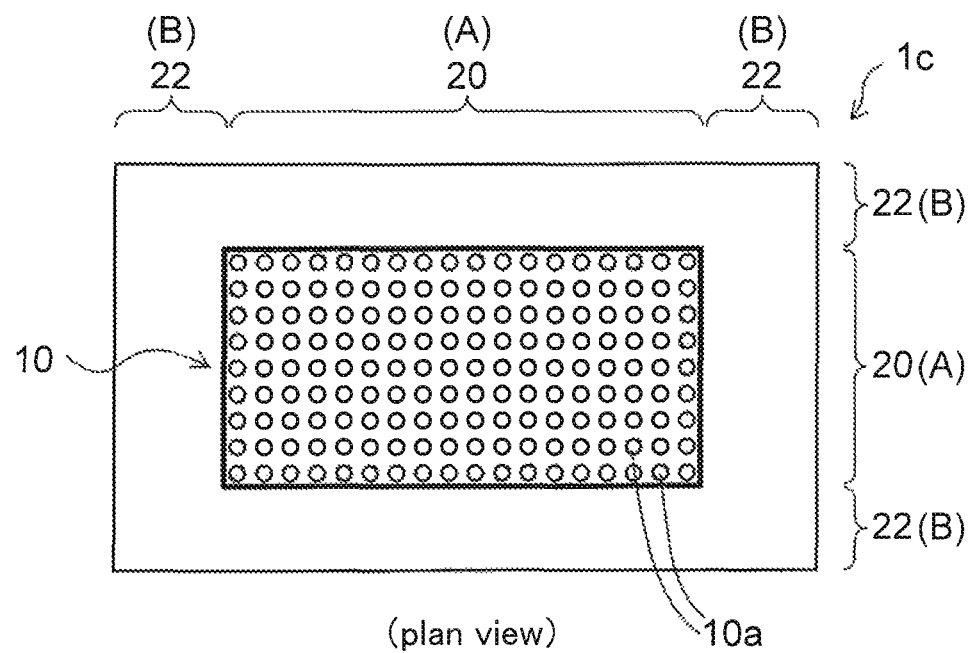

Moreover, like a carbon nanotube sheet 1c depicted in FIGS. 15A and 15B, it is possible to employ a structure in which the carbon nanotubes 10a are provided only in the thermoplastic resin portion 20 in a center area A, and no carbon nanotubes 10a exist in the thermosetting resin portion 22 in the outer periphery area B.

In this case, the carbon nanotube sheet 1c is firmly bonded to the semiconductor element and the heat spreader by the thermosetting resin portion 22 arranged in the entire area of outer periphery area B. This embodiment is disadvantageous in terms of heat radiation performance as compared with the carbon nanotube sheet 1 in FIGS. 1A and 1B since no carbon nanotubes exist in the thermosetting resin portion 22.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a carbon nanotube sheet, comprising:
obtaining a carbon nanotube aggregate by forming a plurality of carbon nanotubes on a substrate;
arranging a thermoplastic resin material on a center area of the carbon nanotube aggregate, and arranging an uncured thermosetting resin material on an outer periphery area of the carbon nanotube aggregate so as to surround the thermoplastic resin material;
fluidizing the thermoplastic resin material and the thermosetting resin material and impregnating spaces in the carbon nanotube aggregate with the thermoplastic resin material and the thermosetting resin material, by performing a heat process; and
removing the substrate.

(Clause 2) The method of manufacturing a carbon nanotube sheet according to Clause 1, wherein
in the impregnating the spaces in the carbon nanotube aggregate with the thermosetting resin material and the thermoplastic resin material,
an upper end of the carbon nanotube aggregate is covered with thermosetting resin material and the thermoplastic resin material, and
the thermosetting resin material is impregnated in the uncured state.

(Clause 3) The method of manufacturing a carbon nanotube sheet according to Clause 2, after the impregnating the spaces in the carbon nanotube aggregate with the thermoplastic resin material and the thermosetting resin material, further comprising,
exposing the upper end of the carbon nanotube aggregate by polishing the thermoplastic resin material and the thermosetting resin material coating the upper end of the carbon nanotube aggregate.

(Clause 4) A method of manufacturing a semiconductor device, comprising:
connecting a semiconductor element to a connection pad of a wiring substrate;
preparing a carbon nanotube sheet including
a carbon nanotube aggregate in which a plurality of carbon nanotubes are arrayed,
a thermoplastic resin portion impregnated in a center area of the carbon nanotube aggregate, and
an uncured thermosetting resin portion impregnated in an outer periphery area of the carbon nanotube aggregate so as to surround the thermoplastic resin portion, and
wherein an upper end of the carbon nanotube aggregate is coated with the thermosetting resin portion and the thermoplastic resin portion;
arranging the carbon nanotube sheet on the semiconductor element; and
arranging a heat radiation member on the carbon nanotube sheet and performing a heat process while pressing the heat radiation member downward, thereby the thermoplastic resin portion and the thermosetting resin portion on the carbon nanotube aggregate is pushed out toward a lateral direction, and the upper end of the carbon nanotube aggregate is made to contact the heat radiation member.

(Clause 5) The method of manufacturing a semiconductor device according to Clause 4, wherein
In the step that the upper end of the carbon nanotube aggregate is made to contact the heat radiation member,
the heat radiation member includes a concave portion on a lower face side, thereby a protruding portion is provided in a periphery of the heat radiation member, and
the protruding portion of the heat radiation member is bonded to the wiring substrate, and an upper face of the carbon nanotube sheet contacts a bottom face of the concave portion of the heat radiation member.

What is claimed is:

1. A carbon nanotube sheet, comprising:
a carbon nanotube aggregate in which a plurality of carbon nanotubes is arrayed;
a plurality of thermoplastic resin portions divided into plural areas in a center area of the carbon nanotube aggregate; and
an uncured thermosetting resin portion formed from a center area of the carbon nanotube aggregate to an outer periphery area of the carbon nanotube aggregate so as to surround each of the plurality of thermoplastic resin portions,
wherein the thermoplastic resin portions and the uncured thermosetting resin portion are formed from a lower end to an upper end of the carbon nanotube aggregate so as to coat the upper end of the carbon nanotube aggregate, and
a side surface of the thermoplastic resin portions and a side surface of the uncured thermosetting resin portion contact in a region between the plurality of carbon nanotubes, and
wherein a layer formed in the carbon nanotube aggregate consists of the plurality of thermoplastic resin portions and the uncured thermosetting resin portion.

* * * * *